United States Patent
Kohav

[11] Patent Number: 6,127,658
[45] Date of Patent: Oct. 3, 2000

[54] WAFER HEATING APPARATUS AND METHOD WITH RADIATION ABSORPTIVE PERIPHERAL BARRIER BLOCKING STRAY RADIATION

[75] Inventor: Gil Kohav, Kiryat Tivo'on, Israel

[73] Assignee: Steag C.V.D. Systems, Ltd., Migdal Ha'Emek, Israel

[21] Appl. No.: 09/128,661

[22] Filed: Aug. 4, 1998

[51] Int. Cl.[7] ............................................... H01L 21/205
[52] U.S. Cl. ..................... 219/390; 219/405; 219/411; 392/416; 392/418; 118/725; 374/121
[58] Field of Search ..................................... 392/416, 418; 219/390, 411, 405; 437/8; 374/1, 121; 118/725, 728, 50.1, 724

[56] References Cited

U.S. PATENT DOCUMENTS

| | | | |
|---|---|---|---|
| 4,041,278 | 8/1977 | Boah | 219/411 |
| 4,560,420 | 12/1985 | Lord | 148/1.5 |
| 4,654,509 | 3/1987 | Robinson et al. | 219/405 |
| 4,752,592 | 6/1988 | Tamura et al. | 438/796 |
| 5,345,534 | 9/1994 | Najm et al. | 392/422 |
| 5,716,133 | 2/1998 | Hosokawa et al. | 374/121 |
| 5,781,693 | 7/1998 | Ballance et al. | 392/416 |
| 5,820,686 | 10/1998 | Moore | 118/730 |
| 5,848,842 | 12/1998 | Peuse et al. | 374/1 |

FOREIGN PATENT DOCUMENTS 63-227014 9/1988 Japan.

Primary Examiner—John A. Jeffery
Attorney, Agent, or Firm—Foley & Lardner

[57] ABSTRACT

Heating apparatus particularly useful for rapid thermal processing of semiconductor wafers, includes: a head having a reflector and a support for supporting a wafer spaced above the reflector; a radiation heater located above the wafer, an optical fiber having one end exposed to the space between the wafer and the reflector for detecting the radiation emitted by the wafer as enhanced by the reflector; a heat measuring device at the opposite end of the optical fiber for producing a temperature measurement corresponding to the radiation emitted by the wafer as enhanced by the reflector; and a peripheral barrier circumscribing the head, reflector, and the wafer for blocking stray radiation from entering the space between the wafer and the reflector from the outer periphery of the head. The wafer support supports the wafer spaced from the peripheral barrier by an upper annular gap which includes an annular barrier projecting outwardly of the wafer towards the radiation heater to block all but low angle radiation from penetrating the annular gap.

18 Claims, 3 Drawing Sheets

WAFER HEATING APPARATUS AND METHOD WITH RADIATION ABSORPTIVE PERIPHERAL BARRIER BLOCKING STRAY RADIATION

FIELD AND BACKGROUND OF THE INVENTION

The present invention relates to an apparatus and method for heating articles and for measuring the temperature of the heated articles. The invention is particularly useful for rapid thermal processing of semiconductor wafers and is therefore described below with respect to this application.

Temperature measurement and temperature uniformity are major difficulties in thermally processing semiconductor wafers by the Rapid Thermal Process (RTP). RTP is used in many thermal processes to optimize the heating of the wafer to reduce cycle time, and to enable fast processing. The wafer is held in a reactor (reaction chamber) and heated by lamps, generally (but not necessarily) tungsten-halogen lamps. The heating rate may exceed 100° C./sec, as compared to 1–2° C./minute in regular furnaces, or 10–50° C./minute in mini-furnaces. The temperature of the chamber walls and other components near the wafer may be totally different (usually lower) than the wafer temperature. The temperature of the reactor gas, if present, may also be different from the wafer temperature.

The physical and chemical reactions that are used to produce electronic devices on semiconductor wafers are very sensitive to temperature. To produce the desired reactions, the temperature over the entire wafer must be uniform within narrow tolerances.

The wafer temperature can not be detected by a device that contacts the wafer because the heat transfer is too slow from the wafer to the temperature detecting device; also, such contact may affect the temperature uniformity over the complete surface of the wafer. Therefore, the temperature is calculated from wafer radiation, measured by a pyrometer. The radiation e of a body at temperature T is given as a function of the wavelength $\lambda$ as follows:

$$e(T, \lambda) = \varepsilon(T, \lambda) \frac{2\pi C_1}{\lambda^5 \left( \frac{e_2}{e^{\lambda = T} - 1} \right)} \quad (1)$$

$$C_1 = 5.9552197 \ast 10^{-17} W \ast m^2,$$

$$C_2 = 0.01438769 m \ast K,$$

where $\varepsilon$ is the emissivity of the body, which depends on the material and surface conditions. The value of the emissivity is always lower than unity. For an opaque body (a body that does not transmit light) the sum of the emissivity and the reflectivity P is 1; that is:

$$\varepsilon(T,\lambda)+p(T,\lambda)=1 \quad (2)$$

For example, if a body reflects 80% (0.8) from the light at a specific temperature and wavelength, its emissivity is 0.2.

If the emissivity of the measured body is known or is constant, calibration and temperature measurement of the body become simple. Unfortunately, this is not the case with semiconductor wafers used for production. During production, layers are added, removed or change many times. The emissivity of a given wafer may vary widely in the range of 0.19–0.91, during the process and is not known beforehand. Direct calculation of the temperature from calibration curves of a standard wafer gives poor results.

The wafer apparent emissivity may be enhanced. A known enhanced emissivity method for temperature measurement uses a flat reflector located at and spaced from the back side of the wafer. The light emitted from the wafer is reflected by the reflection and returns to the wafer, where part of it is reflected back to the reflector and so on. Low emissivity wafers reflect a larger part of the light. The total radiation flux to the mirror is the sum of all the repeated reflections. The simplest model assumes that the wafer and the mirror are two infinite parallel plates, and the measuring device has negligible influence (see below). The enhanced emissivity $\lambda_{eff}$ is $$\varepsilon_{eff} = \varepsilon_w \sum_{n=0}^{\infty} (p_w p_p)^n = \frac{\varepsilon_w}{1 - p_w p_p} \quad (3)$$

where the subscripts w and P are for the wafer and the reflector, respectively.

The radiation emitted by the wafer is generally detected by an optical fiber having one end exposed to the space between the backside of the wafer and reflector, and the opposite end leading to the pyrometer. In order to get accurate measurement, the lamps radiation at the measured wavelength (i.e., stray radiation), as defined below must be prevented, in so far as possible, from reaching the optical fiber. A common method to do this is to place the fiber inside a cylindrical cavity with the wafer on the upper part of the cavity. The wafer lies on an opaque ring, which in turn lies on an opaque cylindrical rim. In this method, however, a large area of the wafer edge is exposed to the cavity wall, and a substantial amount of heat is lost through this exposure. As a result, there is a significant difference between the wafer center temperature and edge temperature, thereby aggravating the temperature non-uniformity problem. A quartz rim, which has low thermal conductivity, produces a better result than a metal rim, but does not eliminate the problem.

SUMMARY OF THE INVENTION

An object of the present invention is to provide heating apparatus, particularly useful for rapid thermal processing of semiconductor wafers, having advantages in the above respects.

Another object of the present invention is to provide a method and apparatus for reducing stray radiation without the need of contact between the wafer and the device that blocks the stray radiation, and in this way to have better temperature uniformity.

According to one aspect of the present invention, there is provided heating apparatus particularly useful for rapid thermal processing of semiconductor wafers, comprising: a head a wafer support for supporting a wafer spaced above the head; a radiation heater located above the wafer when supported on the head; an optical fiber having one end exposed to the space between the wafer and the head for detecting the radiation emitted by the wafer; a heat measuring device at the opposite end of the optical fiber for producing a temperature measurement corresponding to the radiation emitted by the wafer; and a peripheral barrier circumscribing the head, and the wafer spaced above the head, for blocking stray radiation from entering the space between the wafer and the head from the outer periphery of the head; the wafer support supporting the wafer spaced from the peripheral barrier by an annular gap which includes an annular radiation absorptive barrier projecting outwardly of the wafer towards the radiation heater to block all but low angle radiation from penetrating entering the annular gap. The term "stray radiation" as used herein refers to any radiation not emanating from the wafer whose temperature is being measured. A major source of such stray radiation is the heat lamps, as indicated earlier.

According to further features in the preferred embodiment of the invention described below, the wafer support means comprises a plurality of at least three pins extending perpendicularly from the head engageable with the wafer for stably supporting the wafer spaced above the head. Also, the peripheral barrier comprises a radiation-absorptive opaque rim circumscribing the head; and a radiation absorptive opaque ring supported by the rim and defining the annular gap with the wafer when supported over the head.

According to further features in the described preferred embodiment, the annular barrier is in a form of an annular radiation-absorptive opaque strip fixed to the inner edge of the radiation-absorptive ring and also projecting inwardly of the wafer into the space between the wafer and head.

The invention is particularly useful in temperature measurement systems based on the enhanced emissivity method. According to additional features in the described preferred embodiment, therefore the head further includes a reflector underlying the wafer, when supported on the head, and an annular radiation-absorptive surface underlying the radiation-absorptive ring and circumscribing the reflector. The annular radiation-absorptive surface is separated from the reflector by an outer annular groove formed in the head; having a radiation-absorptive surface. The head is further formed with an inner annular groove circumscribing the reflector, inwardly of the outer annular groove, and also having a radiation-absorptive surface. The inner annular groove includes an annular barrier of radiation-absorptive opaque material projecting outwardly of the reflector into the space between the reflector and wafer but slightly spaced from the wafer when supported on the head.

According to another aspect of the present invention, there is provided a method for heating, and measuring the temperature of, semiconductor wafers in the above type rapid thermal processing apparatus, which method comprises supporting the wafer spaced from the peripheral barrier by an annular gap which includes an annular radiation-absorptive barrier projecting outwardly of the wafer towards the radiation heater to block all but low angle radiation from penetrating the annular gap.

Further features and advantages of the invention will be apparent from the description below.

BRIEF DESCRIPTION OF THE DRAWINGS

The invention is herein described, by way of example only, with reference to the accompanying drawings, wherein.

PRIOR ART APPARATUS OF FIG. 1.

Figure 1:
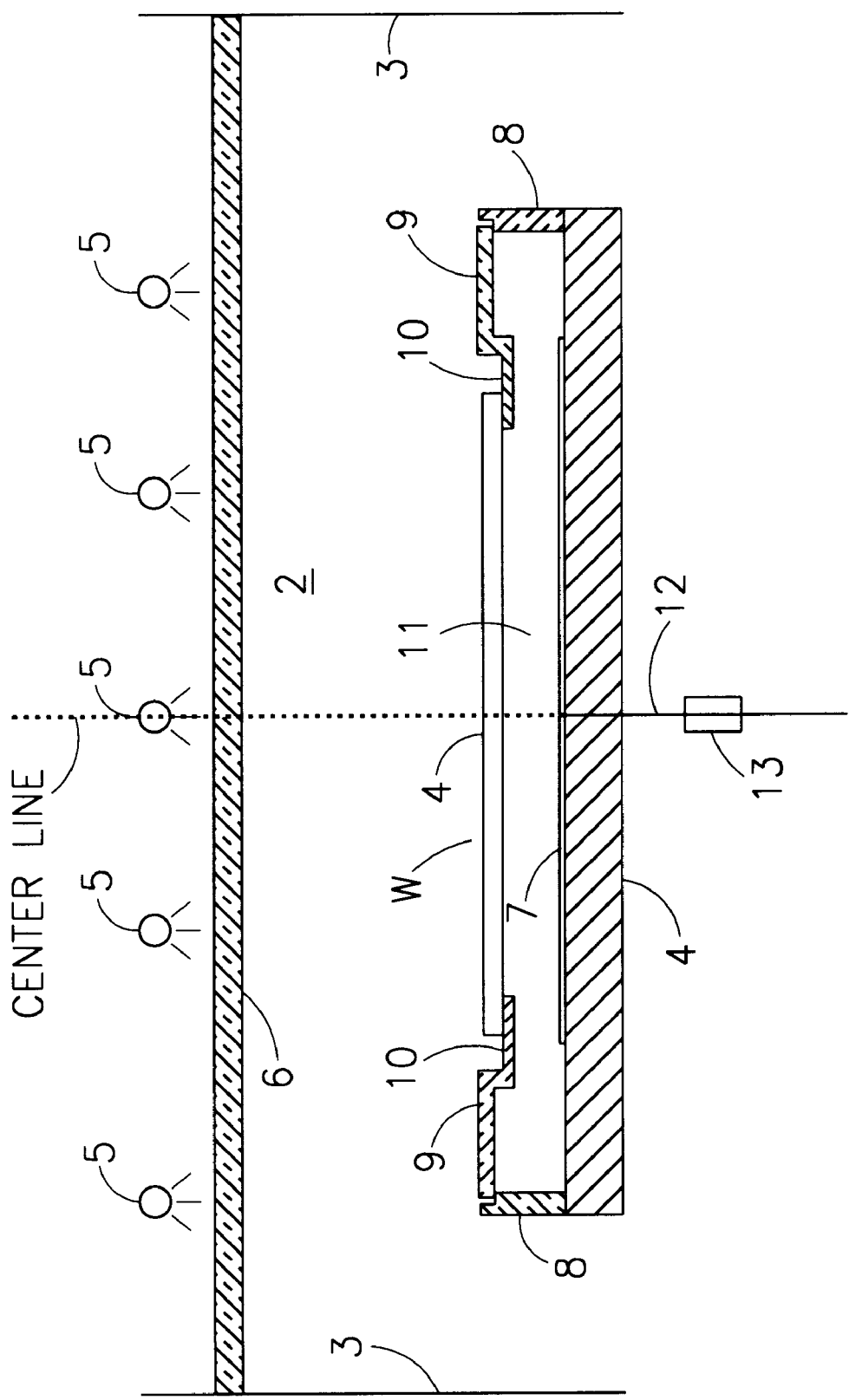
FIG. 1 diagrammatically illustrates a known form of heating apparatus used in the rapid thermal processing of semiconductor wafers.

FIG. 1 diagrammatically illustrates one form of the heating apparatus which addresses stray-radiation problem but not the temperature uniformity problem.

The apparatus illustrated in FIG. 1 includes a heating chamber, generally designated 2, defined by a cylindrical wall 3. A head 4 is located within chamber 2 for supporting a wafer W to be heated by a plurality of heat lamps 5 overlying the head 4 and directing heat radiation, via a quartz window 6, towards the wafer. The upper face of head 4 facing away from wafer W includes a flat reflector 7, preferably in the form of a reflector coating. Reflector 7 is of substantially the same diameter, preferably of slightly larger diameter, than that of the wafer. The wafer W is supported over reflector 7 by a rim 8 around the outer periphery of head 4, and a ring 9. The outer edge of ring 9 is supported by the rim, and its inner edge is formed with an inwardly-stepped ledge 10 for receiving the wafer W.

Ring 9 supports the wafer W in parallel spaced relationship with respect to reflector 7 so as to define a space 11 between the reflector and the wafer. One end of an optical fiber 12 passes through the center of reflector 7 so as to be spaced from the wafer and to be exposed to the radiation within space 11. The opposite end of optical fiber 12 passes through head 4 and is coupled to a heat measuring device 13, e.g. a pyrometer, for producing a temperature measurement corresponding to the radiation emitted by the wafer W as enhanced by the reflector 7.

In order to block stray radiation (namely radiation not emanating from the wafer whose temperature is to be measured, as defined above) from reaching the end of optical fiber 12 exposed to the space 11 between the wafer W and the reflector 8, the outer rim 8 and the outer ring 9 supporting the wafer W preferably have radiation-absorptive surfaces. In addition, in order to minimize heat loss from the outer edge of the wafer W, the outer rim 8 is preferably made of a thermal insulating material, such as quartz.

Since, in the prior art construction illustrated in FIG. 1, ledge 10 of the outer ring 9 continuously contacts the inner surface of the wafer W, along its outer margin, this increases the rate of heat loss from the outer edge, and thereby produces a large temperature differential between the outer edge and the center of the wafer, where the temperature is measured by pyrometer 13.

A PREFERRED EMBODIMENT OF THE INVENTION

Figure 2:
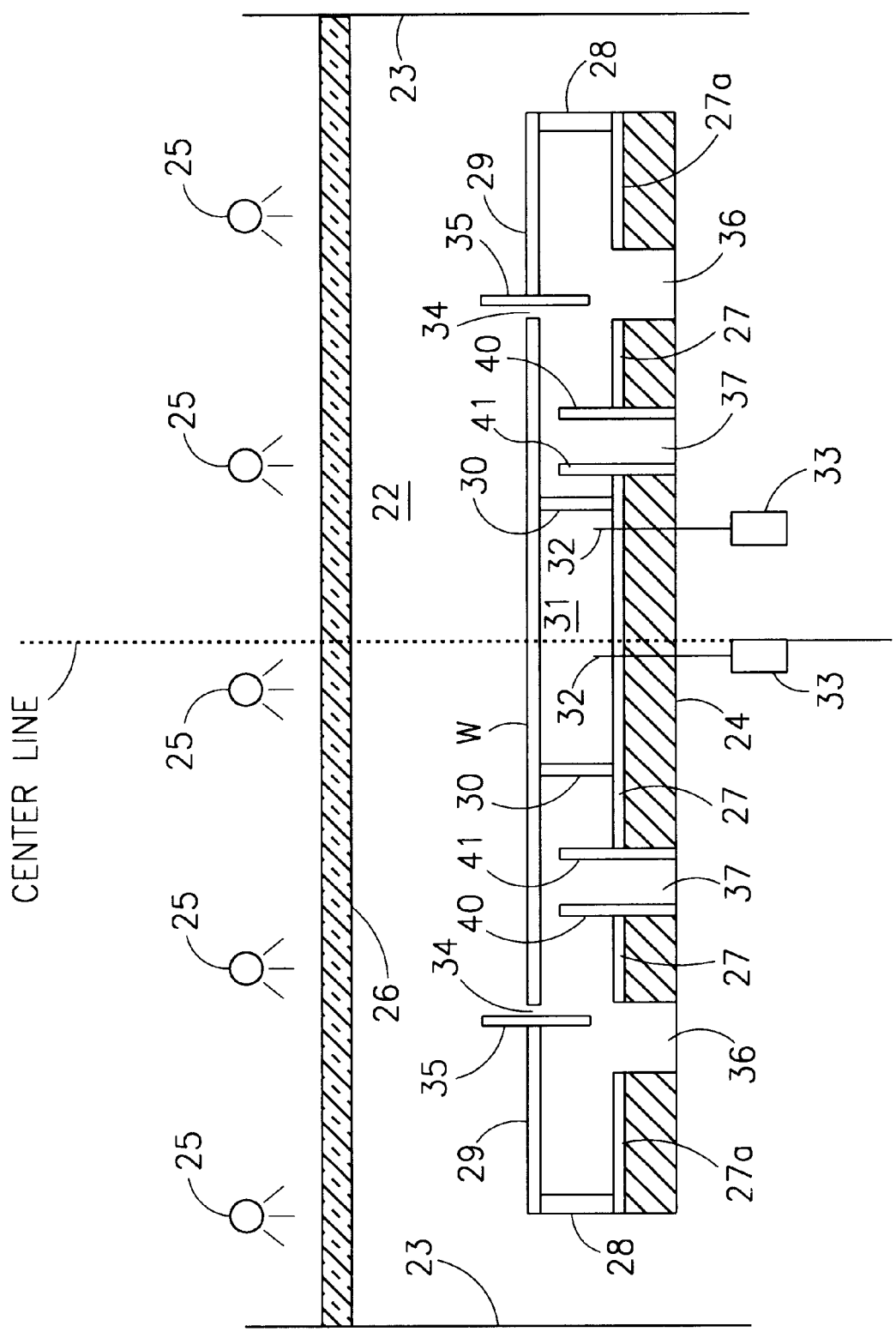
FIG. 2 illustrates one form of heating apparatus constructed in accordance with the present invention.
Figure 3:
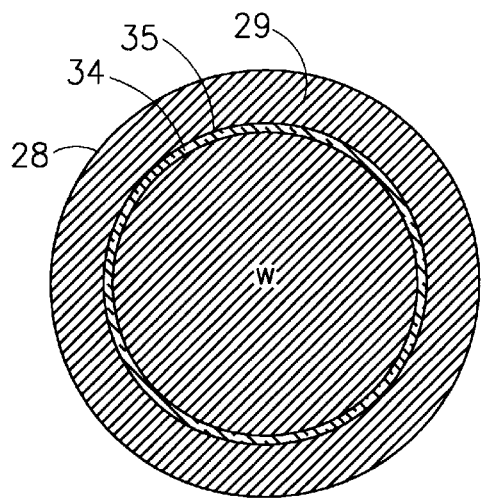
FIG. 3 is a top plan view of the apparatus of FIG. 2 with the wafer present.
Figure 4:
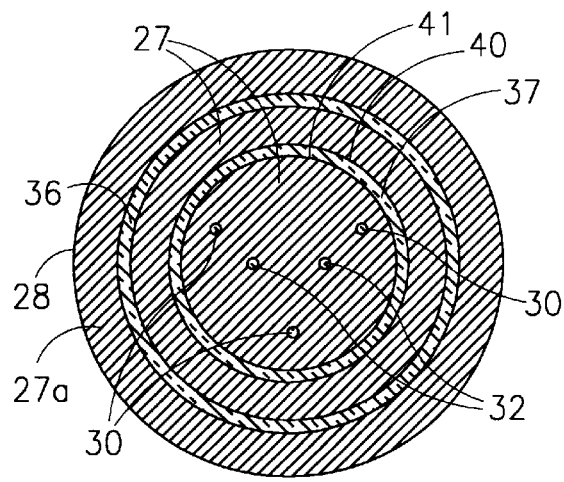
FIG. 4 is a top plan view of the apparatus of FIG. 3 with the wafer removed.

A preferred form of heating and temperature measuring apparatus constructed in accordance with the present invention, to avoid the above drawbacks, is diagrammatically illustrated in FIG. 2.

Thus, as shown in FIG. 2, the wafer W to be heated is supported within a heating chamber 22 defined by cylindrical chamber wall 23. The wafer W is supported on a head 24 and is heated by a plurality of heat lamps 25 via a quartz window 26 overlying the wafer. Underlying the wafer is a flat reflector 27 in the form of a reflector coating in the central region of head 24. As also in the prior art construction of FIG. 1, head 24 is circumscribed by a rim 28 supporting an outer annular ring 29 coplanar with and circumscribing the wafer W to be heated.

In this case, however, the wafer W is supported by a plurality of at least three pins 30 extending perpendicularly from the reflector surface 27 and engageable with the under surface of the wafer. Pins 30 thus stably support the wafer based above the reflector surface, thereby defining a space 31 between the wafer and the reflector surface.

As in the prior art of FIG. 1, the temperature of the wafer W is sensed by an optical fiber 32 having one end passing through reflector surface 27 so as to be spaced from the wafer and to be exposed to the radiations within space 31. The opposite end of optical fiber 32 extends through the head 24 and is coupled to a heat measuring device, namely a pyrometer 33, which producers a temperature measurement corresponding to the radiation emitted by the wafer W as enhanced by the reflector surface 27. The wafer W is opaque at the measured wavelength.

For purposes of example, FIG. 2 illustrates the use of a plurality of optical fibers 32 and pyrometers 33 for sensing the radiations at different parts of the space 31 between the wafer W and the reflector surface 27. This is done in order to produce a more accurate measurement of the wafer temperature at its different surface areas, and thereby to indicate any non-uniformity in the wafer temperature. As will be described below, the need for several pyrometers is reduced due to the better temperature uniformity provided by the illustrated apparatus.

The rim 28, and the outer annular ring 29, are both radiation-absorptive opaque surfaces. This rim and ring thus define a peripheral barrier, as in the prior art apparatus illustrated in FIG. 1, circumscribing the head 24, the reflector surface 27, and the wafer W spaced above the reflector, for blocking stray radiation from entering the space 31 between the wafer and the reflector from the outer periphery of the head.

In this case, however, the pins 30 support the wafer W spaced from the peripheral barrier (defined by rim 28 and rim 29) by an annular gap 34 such that there is no physical contact between the ring 29 and the outer edge of the wafer. In addition this annular gap 34 includes an annular barrier strip 35, in the form of a radiation-absorptive opaque strip, which projects outwardly of the wafer W towards the radiation heater 25 such as to block all but low angle radiation from penetrating the gap 34, as will be described more particularly below with respect to FIG. 5. The radiation absorptive strip 35 also projects inwardly of the wafer W into the space 31 between the wafer and the reflector 27 to substantially block even the low-angle radiation penetrating the annular gap 34 from influencing the reading of pyrometer 33, as will also be described below with respect to FIG. 5.

Head 24 is formed with two annular grooves 36, 37. These grooves are coaxial with the center of the head and the wafer W supported by it, and are on opposite sides of the annular gap 34. The surfaces of the two annular grooves 36, 37 are radiation-absorptive, such that the two grooves in effect define outer and inner annular gaps which are substantially wider than annular gap 34. As shown in FIG. 2, the reflector coating 27 covers the entire surface of head 24 within the inner annular groove 37 and between the two annular grooves 37, 36. These surfaces of head 24 are therefore reflective, whereas the surface 27 a of head 27 outwardly of the outer annular groove 36 is radiation-absorptive.

An annular, radiation-absorptive barrier strips 40, 41 is applied to each of the two opposite edges of the inner annular groove 37 defining the inner annular gap. The two radiation-absorptive strips 40, 41 extend into the space 31 between the reflector 27 and the wafer W, but terminate just short of contact with the wafer. Thus the only elements which actually contact the wafer W are the pins 30 stably supporting the wafer above the reflector.

As one example, head 24 may be at least 5 mm thick; the wafer W may be supported about 2 mm above the reflective coating 27 of the head; the annular barrier strip 35 may be located 5–10 mm from the rim 28, may be 3–4 mm in width, and may define an annular gap with the outer edge of the wafer W of about 0.5 mm; the two annular grooves 36, 37 may be 2–3 mm in width; and the two annular barrier strips 40, 41 may be spaced from the under face of the wafer W about 0.5 mm. The heat lamps 25 are preferably tungsten-halogen lamps that have a maximal temperature of about 2700° C. (3000 K). The reflector coating may be of titanium oxide or other material highly reflective (at least 96%) to the wavelength detected by the pyrometer 33. The radiation-absorptive coatings may be graphite or other material which is highly absorptive to the wavelength detected by the pyrometer. Pins 30 supporting wafer W, and also the outer rim 28, are preferably of quartz.

It will be seen that the wafer W physically contacts only the supporting pins 30. It will also be seen that the annular gap 34 between the wafer and the outer ring 29 constitutes the only opening that can be penetrated by the radiation into the space 31 exposed to the optical fiber 32 connected to the pyrometer 33, which produces a temperature measurement corresponding to the radiation emitted by the wafer as enhanced by the reflector 26. This annular gap 34 may be of very small width, in the order of 0.5 mm, and is bordered by the radiation-absorptive strip 35 which projects outwardly of the wafer W towards the radiation heat lamps 24, and also inwardly of the wafer towards the reflector 27. As a result, the barrier strip 35 blocks all but very low angle radiation (i.e. radiation forming very small angles with respect to the normal to the wafer W) from entering the annular gap 34; moreover the small amount of low-angle radiation entering that gap is substantially reduced or eliminated by traps and barriers, defined by the radiation-absorptive surfaces of the annular grooves 36, 37, and of the annular barrier strips 40 and 41 before such radiation can reach the optical fiber 32 to influence the reading of the pyrometer 33.

The radiation-absorptive surfaces of the rim, ring and barriers should be opaque, and should have high emissivity (0.9 or more) with regard to the wavelength measured by the pyrometer. They are not required to have any special optical property at other wavelengths, The emissivity of these surfaces for other wavelengths, in particular for the range in which the wafer emits most of the radiation, should be much lower. Low emissivity surfaces reflect a large part of the wafer radiation back to the wafer, thereby reducing heat losses and helping to reduce temperature non-uniformity.

Figure 5:
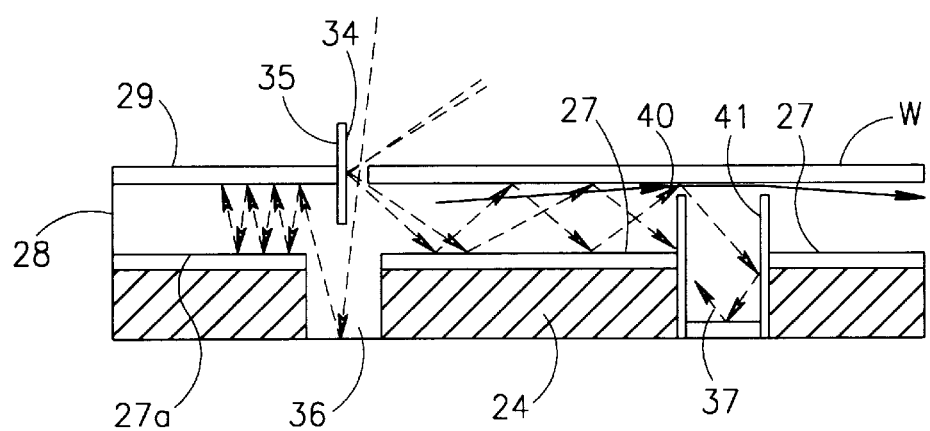
FIG. 5 is a diagram illustrating the manner which the apparatus of FIGS. 1–3 eliminates or substantially reduces stray radiation from the temperature measuring device.

FIG. 5 illustrates typical paths of radiation in the apparatus of FIG. 2. The area of the annular gap 34 is less than 1% of the wafer area. As shown in FIG. 5, the annular gap 34 should be slightly outwardly of the reflector surface 27 so that the radiation cannot impinge on the reflector surface directly via this gap, but rather must first impinge the radiation-absorptive surfaces defined by barrier 34, the edges of the outer annular groove 36, the outer surface 27 of head 24, barrier strips 40, 41, and the surfaces of the inner annular gap 37. The foregoing traps work like "blackbodies", to internally absorb substantially all the radiation penetrating the annular gap 34.

Several simulations were done for a wafer diameter of 200 mm to test the effectiveness of the traps and barriers, using Opticad software. The simulations were based on sending large number of beams (2–3 millions) from the lamps at random directions. The path of each beam was calculated, together with its power, which decreased each time the beam hit a surface. The simulations compared the power of the beams that hit the wafer center to the power that hit the fiber. The simulations showed that even without the inner trap (37), the radiation power from several sources may be reduced to below $10^{-6}$ from its value above the wafer, and that the trap surfaces absorb 95% of the power. An absorption of 90% gives also results below $10^{-6}$ or slightly above. The inner trap and barriers reduce significantly the radiation to values significantly below $10^{-6}$.

While the invention has been described with respect to one preferred embodiment, it will be appreciated that this is set forth merely for purposes of example, and that many variations may be made. For example, the wafer W could be supported by supporting pins which extend radially from the rim 29, which pins are bent axially at their inner ends to produce small-point contacts with the under surface of the wafer. In addition, one or both of the traps defined by the two annular grooves 36, 37, could be omitted. Many other variations, modifications and applications of the invention will be apparent

I claim:

1. Heating apparatus particularly useful for rapid thermal processing of semiconductor wafers, comprising:
    a head having a wafer support for supporting a wafer spaced above the head;
    a radiation heater located above the wafer when supported on the head;
    an optical fiber having one end exposed to the space between the wafer and said head for detecting the radiation emitted by the wafer;
    a heat measuring device at the opposite end of the optical fiber for producing a temperature measurement corresponding to the radiation emitted by the wafer; and
    a peripheral barrier circumscribing said head, and the wafer spaced above the head, for blocking stray radiation from entering the space between the wafer and the head from the outer periphery of the head;
    wherein said wafer support supporting the wafer is spaced from said peripheral barrier by an annular gap which includes an annular radiation-absorptive barrier projecting outwardly of the wafer towards said radiation heater to block all but low angle radiation from entering said annular gap.

2. The apparatus according to claim 1, wherein said wafer support means comprises a plurality of at least three pins extending perpendicularly from said head engageable with said wafer for stably supporting the wafer spaced above the head.

3. The apparatus according to claim 1, wherein said peripheral barrier comprises;
    a radiation absorptive opaque rim circumscribing said head;
    and a radiation absorptive opaque ring supported by said rim and defining said annular gap with the wafer, when supported over the head.

4. The apparatus according to claim 3, wherein said annular radiation-absorptive barrier projecting outwardly of the wafer is in the form of an annular radiation-absorptive opaque strip fixed to an inner edge of said radiation-absorptive ring.

5. The apparatus according to claim 4, wherein said annular radiation-absorptive barrier also projects inwardly of the wafer into said space between the wafer and head.

6. The apparatus according to claim 3, wherein said head further includes a reflector to underlie the wafer when supported on the head, and an annular radiation-absorptive surface underlying said radiation absorptive ring and circumscribing said reflector.

7. The apparatus according to claim 6, wherein said annular radiation-absorption surface is separated from said reflector by an outer annular groove formed in said head and having a radiation-absorptive surface.

8. The apparatus according to claim 1, wherein:
    said wafer-support comprises a plurality of at least three pins extending perpendicularly from said head engageable with said wafer for stably supporting the wafer spaced above the head; and
    said peripheral barrier comprises a radiation-absorptive opaque rim of quartz circumscribing said head, and an upper radiation absorptive opaque ring supported by said rim and defining said annular gap with the wafer when supported over the head.

9. A method of heating, and measuring the temperature of, a semiconductor wafer in a rapid thermal processing apparatus including:
    a head having a wafer support for supporting a wafer spaced above the head;
    a radiation heater located above the wafer when supported on the head;
    an optical fiber having one end exposed to the space between the wafer and said head for detecting radiation emitted by the wafer;
    a heat measuring device at the opposite end of the optical fiber for producing a temperature measurement corresponding to the radiation emitted by the wafer; and
    a peripheral barrier circumscribing said head, and the wafer spaced above the head, for blocking stray radiation from entering the space between the wafer and the head from the outer periphery of the head;
    said method comprising: supporting the wafer spaced from said peripheral barrier by an annular gap which includes an annular radiation-absorptive barrier projecting outwardly of the wafer towards the radiation heater to block all but low angle radiation from entering said annular gap.

10. The method according to claim 9, wherein said wafer is supported by a plurality of at least three pins extending perpendicularly from said head engageable with the wafer for stably supporting the wafer spaced above the head.

11. The method according to claim 9, wherein said peripheral barrier comprises;
    a radiation-absorptive opaque rim circumscribing said head;
    and a radiation absorptive opaque ring supported by said rim and defining said annular gap with the wafer, when supported over the head.

12. The method according to claim 11, wherein said radiation-absorptive barrier is in the form of an annular radiation-absorptive strip fixed to an inner edge of said radiation-absorptive ring.

13. The method according to claim 11, wherein the head further includes a reflector underlying the wafer when supported on the heal, and an annular radiation-absorptive surface underlying said radiation-absorptive ring and circumscribing the reflector; and wherein said annular radiation-absorptive surface is separated from the reflector by an annular groove having a radiation-absorptive surface.

14. Heating apparatus particularly useful for rapid thermal processing of semiconductor wafers, comprising:
    a head having a wafer support for supporting a wafer spaced above the head;
    a radiation heater located above the wafer when supported on the head;

an optical fiber having one end exposed to the space between the wafer and said head for detecting the radiation emitted by the wafer;

a heat measuring device at the opposite end of the optical fiber for producing a temperature measurement corresponding to the radiation emitted by the wafer; and a peripheral barrier circumscribing said head, and the wafer spaced above the head, for blocking stray radiation from entering the space between the wafer and the head from the outer periphery of the head;

wherein said wafer support supporting the wafer is spaced from said peripheral barrier by an annular gap which includes an annular radiation-absorptive barrier projecting outwardly of the wafer towards said radiation heater to block all but low angle radiation from entering said annular gap;

wherein said peripheral barrier comprises a radiation absorptive opaque rim circumscribing said head and a radiation absorptive opaque ring supported by said rim and defining said annular gap with the wafer, when supported over the head;

wherein said head further includes a reflector to underlie the wafer when supported on the head, and an annular radiation-absorptive surface underlying said radiation absorptive ring and circumscribing said reflector; said annular radiation-absorption surface is separated from said reflector by an outer annular groove formed in said head and having a radiation-absorptive surface; and wherein said head is formed with an inner annular groove circumscribing said reflector, inwardly of said outer annular groove; said inner annular groove also being formed with a radiation-absorptive surface.

15. The apparatus according to claim 14, wherein said inner annular groove includes an annular barrier of radiation-absorptive opaque material projecting outwardly of the reflector into said space between the reflector and wafer but slightly spaced from the wafer when supported on the head.

16. The apparatus according to claim 15, wherein said inner annular groove includes two of said annular barriers each fixed to one of the two edges defining said inner annular groove.

17. The apparatus according to claim 16, wherein said reflector is in the form of a coating on the surface of said head within said outer annular groove; the surface of said head outwardly of said outer annular groove being of radiation-absorptive material.

18. A method of heating, and measuring the temperature of, a semiconductor wafer in a rapid thermal processing apparatus including:

a head having a wafer support for supporting a wafer spaced above the head;

a radiation heater located above the wafer when supported on the head;

an optical fiber having one end exposed to the space between the wafer and said head for detecting radiation emitted by the wafer;

a heat measuring device at the opposite end of the optical fiber for producing a temperature measurement corresponding to the radiation emitted by the wafer;

and a peripheral barrier circumscribing said head, and the wafer spaced above the head, for blocking stray radiation from entering the space between the wafer and the head from the outer periphery of the head;

said method comprising: supporting the wafer spaced from said peripheral barrier by an annular gap which includes an annular radiation-absorptive barrier projecting outwardly of the wafer towards the radiation heater to block all but low angle radiation from penetrating said annular gap;

wherein said peripheral barrier comprises a radiation absorptive opaque rim circumscribing said head and a radiation absorptive opaque ring supported by said rim and defining said annular gap with the wafer, when supported over the head;

wherein the head further includes a reflector underlying the wafer when supported on the head, and an annular radiation-absorptive surface underlying said radiation-absorptive ring and circumscribing the reflector, and wherein said annular radiation-absorptive surface is separated from the reflector by an annular groove having a radiation-absorptive surface; and wherein said head is formed with said annular groove and with a further annular groove inwardly thereof; said further annular groove also having a radiation-absorptive surface and further having at least one annular radiation-absorptive barrier projecting outwardly of the head towards, but spaced from, said wafer when supported on the head.

* * * * *